United States Patent
Yang et al.

(10) Patent No.: US 9,293,358 B2
(45) Date of Patent: Mar. 22, 2016

(54) DOUBLE PATTERNING METHOD OF FORMING SEMICONDUCTOR ACTIVE AREAS AND ISOLATION REGIONS

(71) Applicant: Silicon Storage Technology, Inc., San Jose, CA (US)

(72) Inventors: Jeng-Wei Yang, Zhubei (TW); Chien-Sheng Su, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 44 days.

(21) Appl. No.: 14/162,309

(22) Filed: Jan. 23, 2014

(65) Prior Publication Data
US 2015/0206788 A1    Jul. 23, 2015

(51) Int. Cl.
*H01L 21/336*    (2006.01)
*H01L 21/762*    (2006.01)
*H01L 21/308*    (2006.01)

(52) U.S. Cl.
CPC ...... *H01L 21/76224* (2013.01); *H01L 21/3086* (2013.01); *H01L 21/3088* (2013.01)

(58) Field of Classification Search
CPC ......................... H01L 29/788; H01L 21/76224
USPC ........................................................ 438/197
See application file for complete search history.

(56) References Cited

U.S. PATENT DOCUMENTS

| 6,756,633 | B2* | 6/2004 | Wang et al. .............. 257/317 |
| 7,315,056 | B2 | 1/2008 | Klinger et al. |
| 2010/0176479 | A1 | 7/2010 | Postnikov et al. |
| 2011/0248382 | A1* | 10/2011 | Pellizzer et al. .......... 257/539 |
| 2012/0108032 | A1 | 5/2012 | Yin et al. |

OTHER PUBLICATIONS

PCT Search Report and Written Opinion dated Mar. 13, 2015 corresponding to the related PCT Patent Application No. US2014/070674.

* cited by examiner

*Primary Examiner* — Ajay K Arora
(74) *Attorney, Agent, or Firm* — DLA Piper LLP (US)

(57) ABSTRACT

A method of forming active areas and isolation regions in a semiconductor substrate using a double patterning process. The method include forming a first material on the substrate surface, forming a second material on the first material, forming a plurality of first trenches into the second material wherein the plurality of first trenches are parallel to each other, forming a second trench into the second material wherein the second trench is perpendicular to and crosses the plurality of first trenches in a central region of the substrate, filling the first and second trenches with a third material, removing the second material to form third trenches in the third material that are parallel to each other and do not extend through the central region of the substrate, and extending the third trenches through the first material and into the substrate.

10 Claims, 13 Drawing Sheets

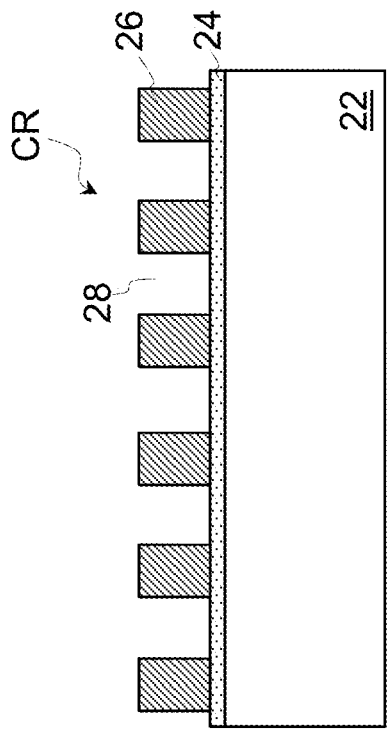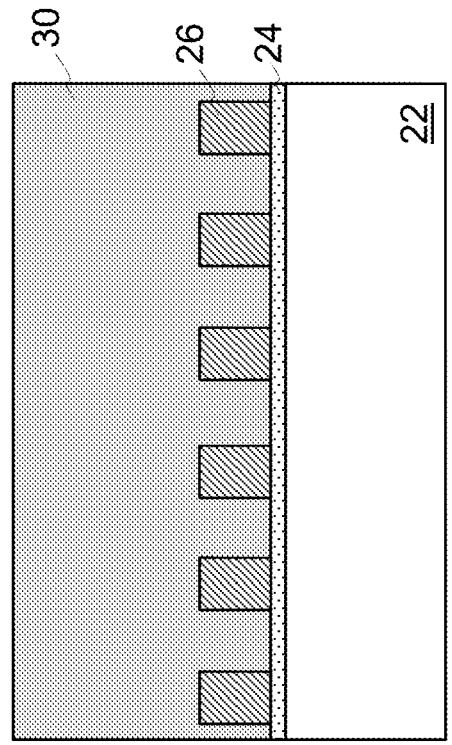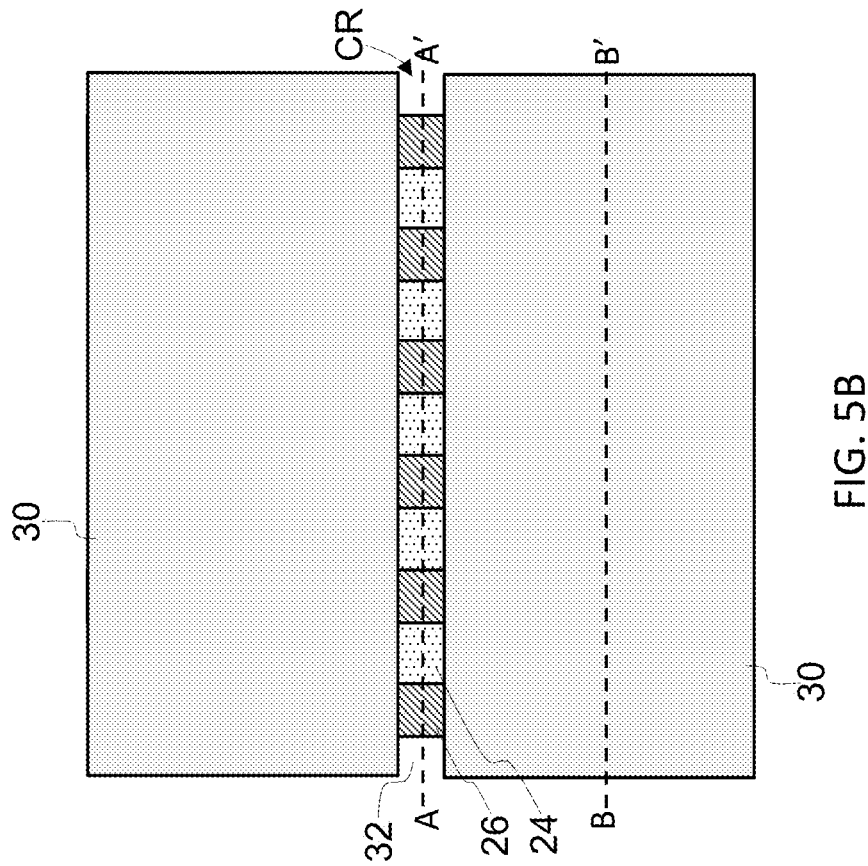

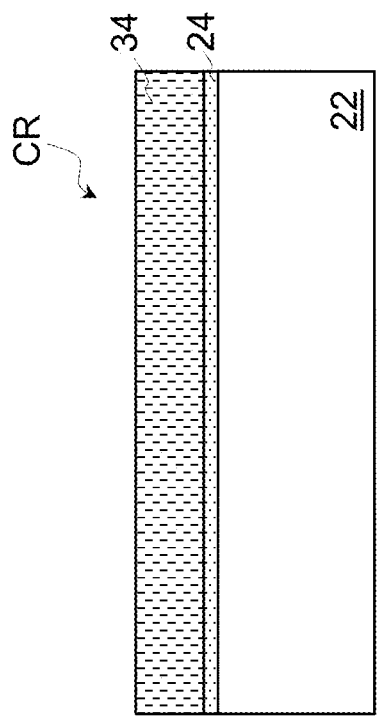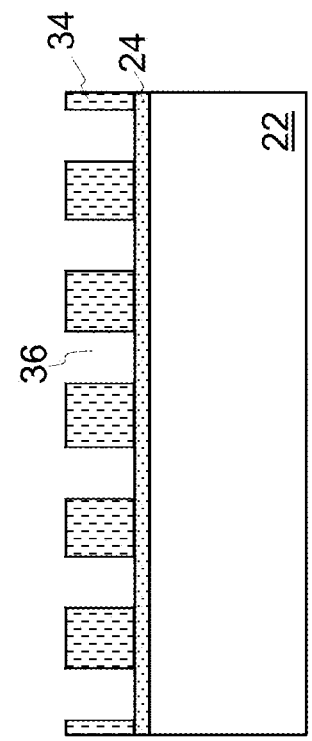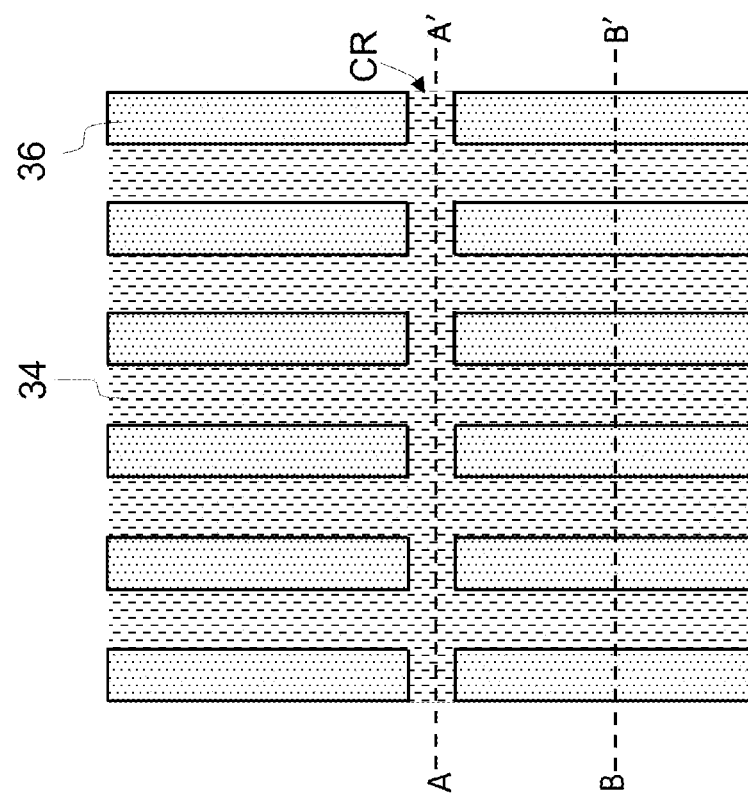

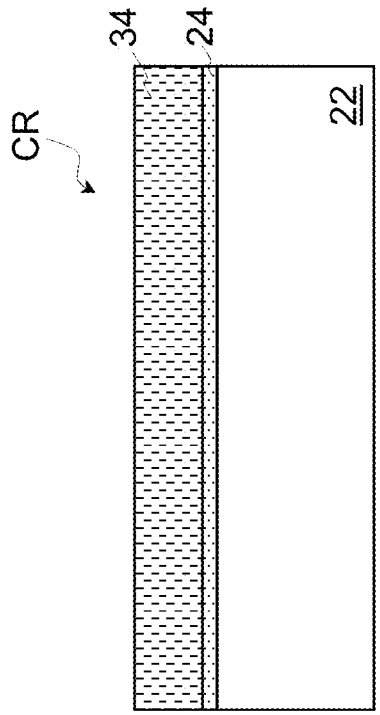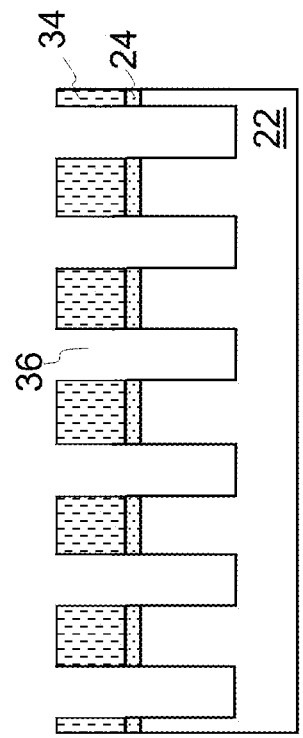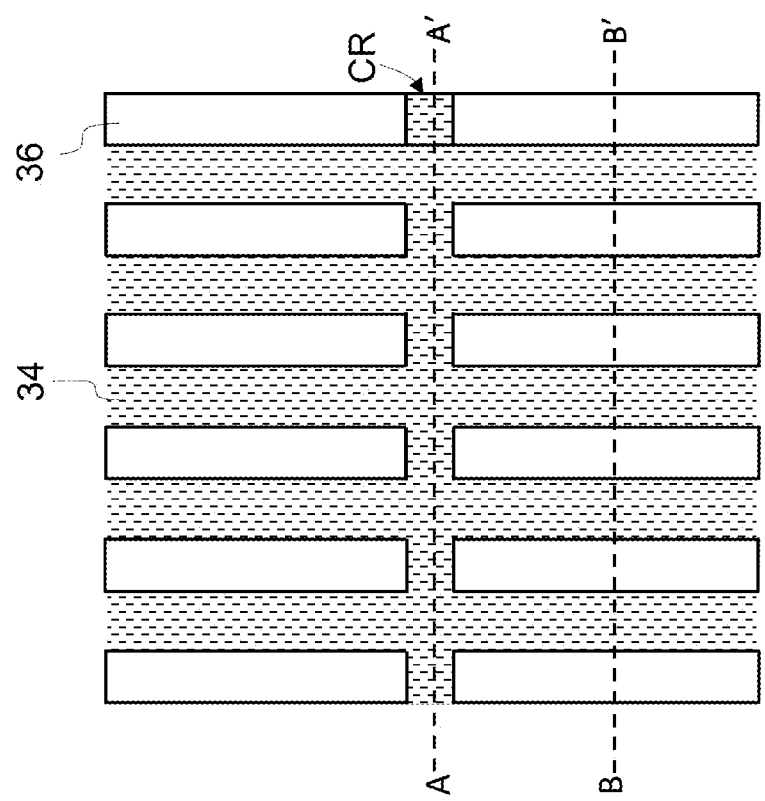

DOUBLE PATTERNING METHOD OF FORMING SEMICONDUCTOR ACTIVE AREAS AND ISOLATION REGIONS

FIELD OF THE INVENTION

The present invention relates to semiconductor devices, and more particularly to the front end processing of semiconductor wafers to form active areas and isolation regions therein.

BACKGROUND OF THE INVENTION

The formation of active areas and isolation regions on semiconductor substrates is well known. Active areas are those regions of the semiconductor substrate on and/or in which semiconductor devices are formed. The isolation regions are insulation regions of the semiconductor substrate between the active areas.

Two well-known techniques for forming the isolation regions on a substrate are LOCOS and STI. Both techniques involve a photolithography process with a single masking step in which photo resist is formed over the substrate and selectively exposed to light using a photo mask, whereby only selective portions of the photo resist are removed (e.g. those portions exposed to light through the mask for the case of positive photolithography). Insulation material is formed on and/or in the substrate in those selective portions where the photo resist had been removed. See for example, U.S. Pat. No. 7,315,056, which is incorporated herein by reference for all purposes.

FIG. 1 illustrates the top plan view of a semiconductor substrate 10 in which isolation regions 12 of insulation material are formed. The areas between the isolation regions 12 are the active areas 14. The configuration of FIG. 1 can be used, for example, in the formation of an array of memory devices such as flash memory cells.

FIG. 2 illustrates a photo mask 16 suitable for forming the active areas and isolation regions of FIG. 1. The mask includes opaque regions 16a (to block light) and transparent or open regions 16b (through which light will pass). The shape and dimensions of the light passing through and focused onto the substrate dictate the shape and dimensions of the active areas and isolation regions on the substrate 10.

Due to diffraction and/or process effects, the shape of the active areas and isolations regions formed on the substrate do not match exactly the shape of the opaque and transparent regions of the mask. Therefore, it is known to implement Optical Proximity Correction (OPC), whereby the shape of the mask is altered to compensate for such errors. OPC is used to compensate for distortions in line widths as well as rounded corners, which otherwise could adversely affect the electrical properties of the device(s) being fabricated. OPC involves moving edges or adding extra polygons to the pattern written on the photo mask. FIG. 3 is an example of an OPC corrected mask 18, where the dimensions and shape of the opaque and transparent regions 18a/18b are altered to more accurately fabricate the pattern of FIG. 1.

However, even with OPC, there can still be intolerable variations in active corner rounding and in critical dimensions of the pattern due to photo patterning conditions (i.e. variations in photo lithography equipment, exposure energy, development time, etc.). FIG. 4 illustrates the types of variations in the fabrication of the isolation regions 12 even with the implementation of OPC, where the ends 20 of the isolation regions 12 vary from region to region and wafer to wafer. OPC and CD optimization becomes more difficult as devices continue to shrink in size. Because the separation distance between the isolation regions 12 is an important critical dimension of the resulting devices, there is a need to better control the formation of the active areas and isolation regions.

BRIEF SUMMARY OF THE INVENTION

A method of forming active areas and isolation regions in a semiconductor substrate by forming a first material on the substrate surface, forming a second material on the first material, forming a plurality of first trenches into the second material wherein the plurality of first trenches are parallel to each other, forming a second trench into the second material wherein the second trench is perpendicular to and crosses the plurality of first trenches in a central region of the substrate, filling the first and second trenches with a third material, removing the second material to form third trenches in the third material that are parallel to each other and do not extend through the central region of the substrate, and extending the third trenches through the first material and into the substrate.

Other objects and features of the present invention will become apparent by a review of the specification, claims and appended figures.

BRIEF DESCRIPTION OF THE DRAWINGS

FIGS. 5A-5I are top views showing in sequence the steps in forming active areas and isolation regions on a semiconductor substrate.

FIGS. 6A-6I are cross sectional views taken along the line A-A' of FIGS. 5A-5I showing in sequence the steps in forming active areas and isolation regions on a semiconductor substrate.

FIGS. 7A-7I are cross sectional views taken along the line B-B' of FIGS. 5A-5I showing in sequence the steps in forming active areas and isolation regions on a semiconductor substrate.

DETAILED DESCRIPTION OF THE INVENTION

Disclosed herein is a method of forming active areas and isolation regions in semiconductor wafers. The method better defines, and provides better control over, the pattern and critical dimensions of the areas and regions formed on the semiconductor wafer. FIGS. 5A-5I, 6A-6I and 7A-7I illustrate fabrication method of the active areas and isolation regions on a semiconductor wafer substrate, with FIGS. 5A-5I illustrating top views, FIGS. 6A-6I illustrating cross sectional views along the line A-A' in FIGS. 5A-5I, and FIGS. 7A-7I illustrating cross sectional views along the line B-B' in FIGS. 5A-5I.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between). For example, forming an element "over a substrate" can include forming the element directly on the substrate with no intermediate materials/elements therebetween, as well as forming the element indirectly on the substrate with one or more intermediate materials/elements therebetween.

Figure 1:
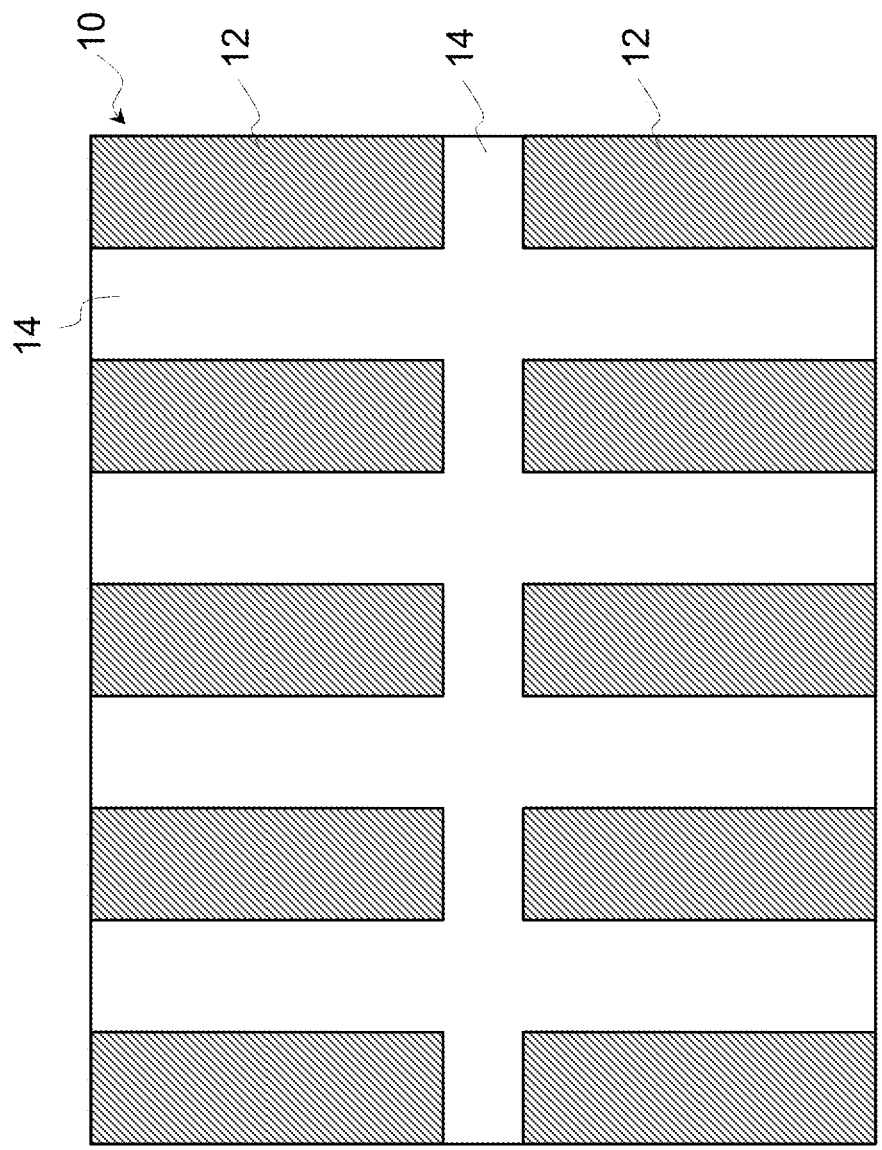
FIG. 1 is a top plan view of conventional isolation regions and active areas formed on a semiconductor substrate.
Figure 2:
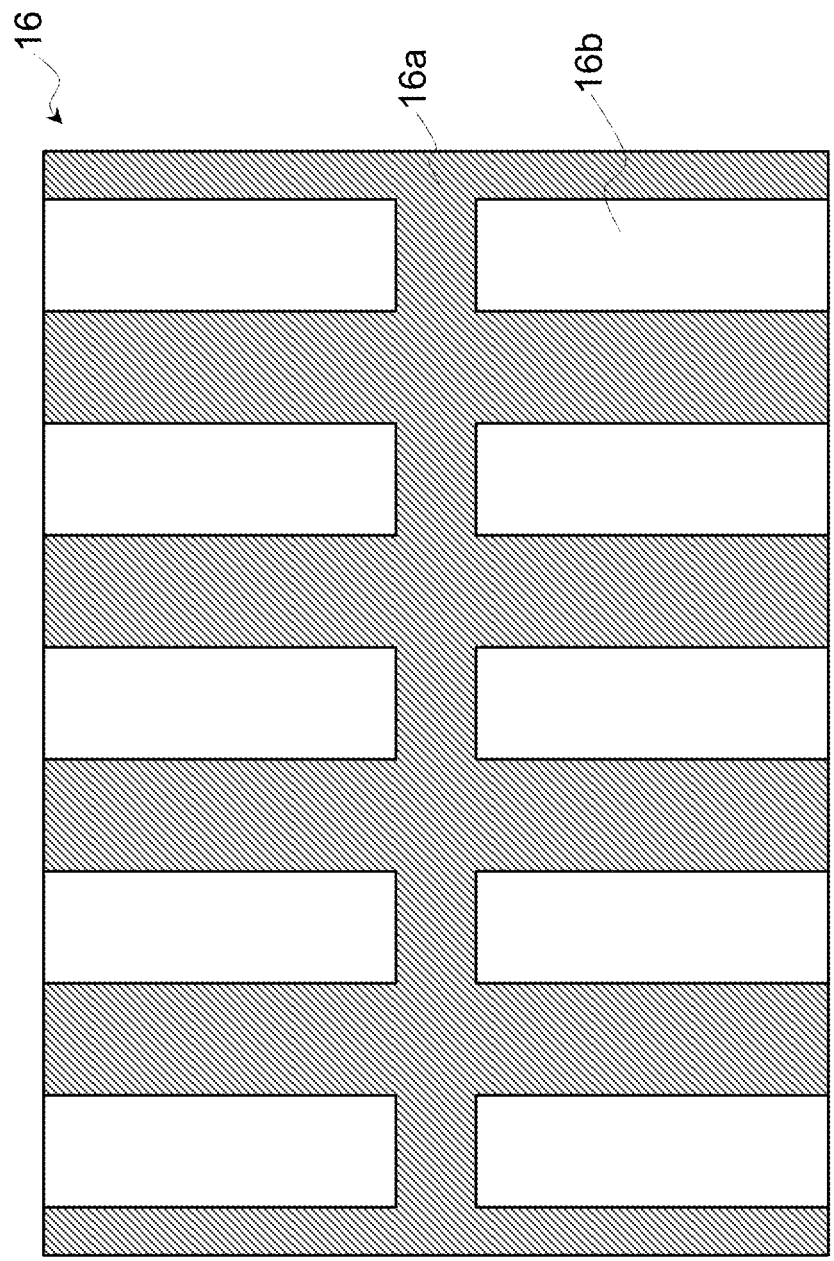
FIG. 2 is a top view of a conventional photolithography photomask used to form the isolation regions and active areas of FIG. 1.
Figure 3:
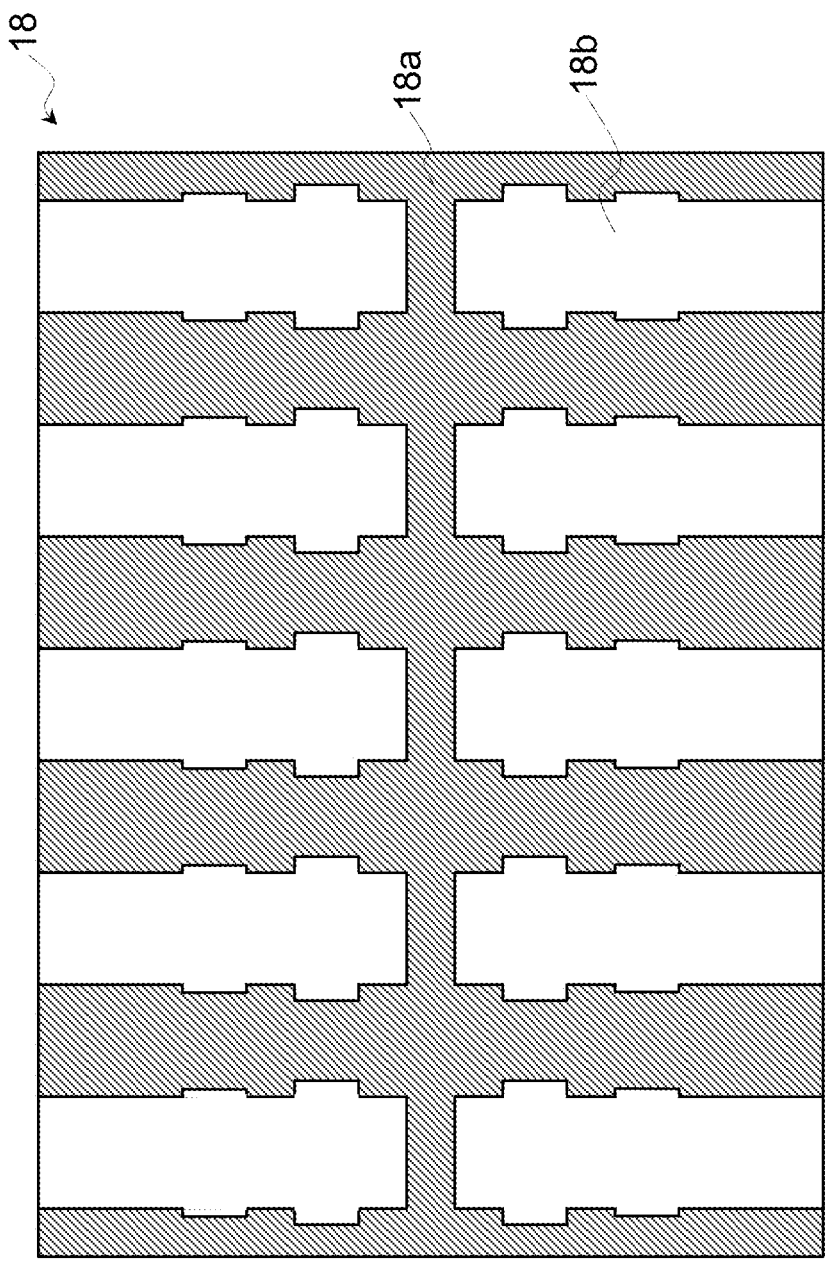
FIG. 3 is a top view of a conventional photolithography photomask with OPC correction used to form the isolation regions and active areas of FIG. 1.
Figure 4:
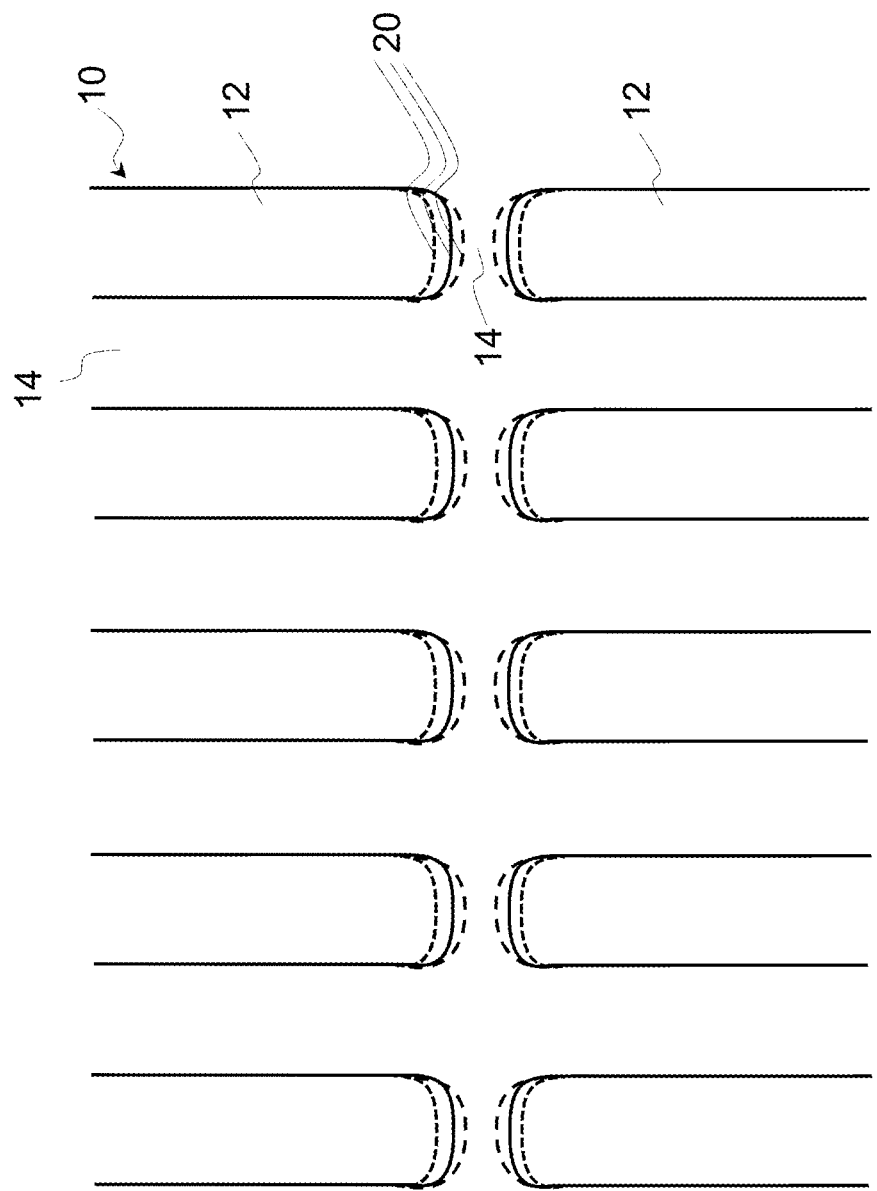
FIG. 4 is a top view of conventional isolation regions and active areas formed on a semiconductor substrate, illustrating variations in the isolation regions that may occur in fabrication.
Figure 6A:
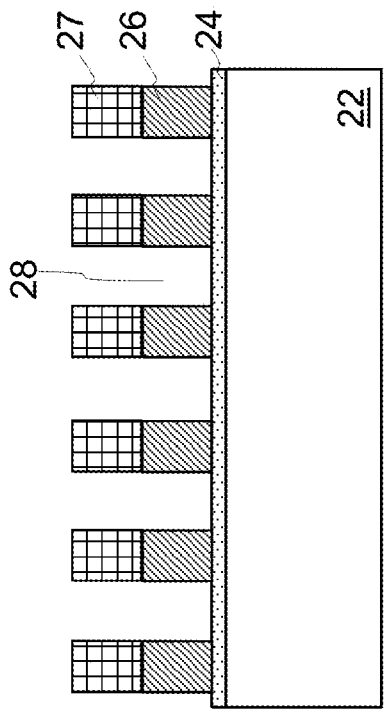
Figure 7A:
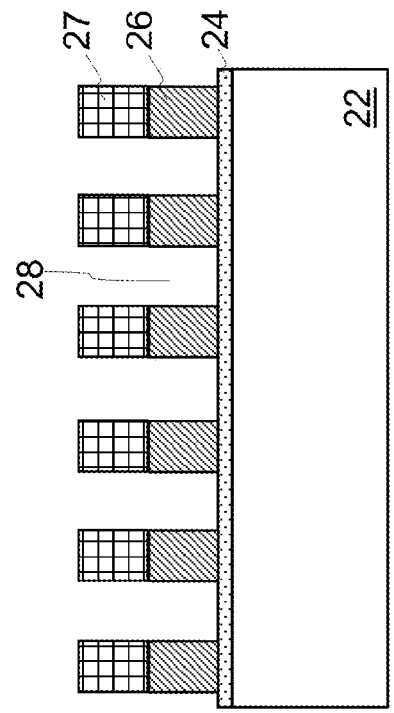
Figure 5A:
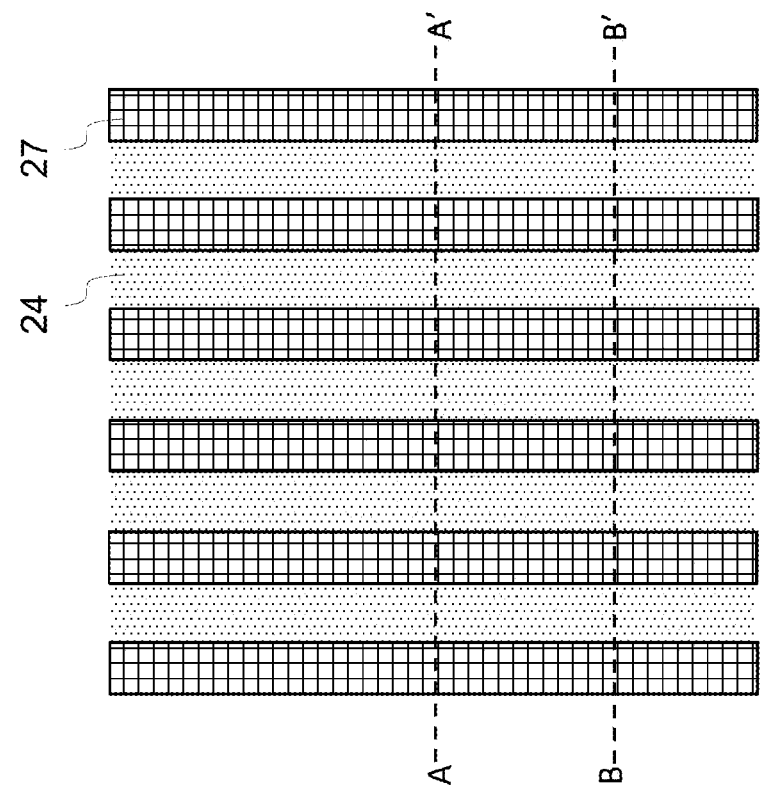

The method begins by providing a semiconductor substrate 22 as shown in FIGS. 5A, 6A and 7A, which is preferably of P type and is well known in the art. A first layer of insulation material 24, such as silicon dioxide (oxide), is formed on the substrate 22. Layer 24 can be formed, for example, by oxidation or by deposition (e.g. chemical vapor deposition CVD). A layer of dummy material 26 such as polysilicon (poly) is formed on insulation layer 24. The formation of the poly layer 26 can be made by a well known process such as Low Pressure CVD or LPCVD. A suitable first photo-resist material 27 is formed on the poly layer 26 and a masking step is performed to selectively remove the photo-resist material 27 from certain regions (e.g. parallel stripes in the column direction as shown). Where the photo-resist material 27 is removed, the exposed portions of the poly layer 26 are then etched away using standard etching techniques (i.e. anisotropic etch process), leaving parallel trenches 28 in the poly layer 26. The resulting structure is shown in FIGS. 5A, 6A and 7A. As shown in FIGS. 6A and 7A, the structure at this stage is uniform across both cross sections A-A' and B-B', where parallel, vertical trenches 28 are formed in poly layer 26.

Figure 6C:
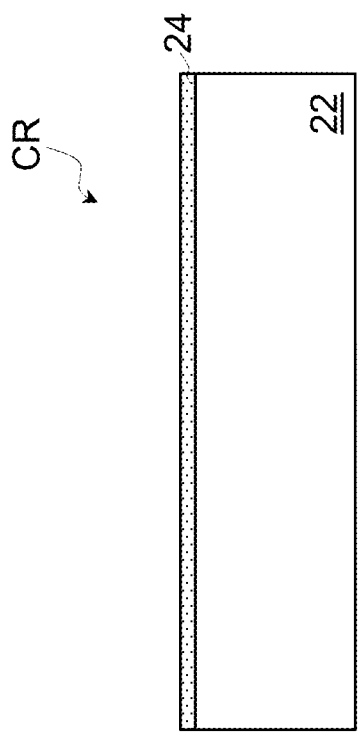
Figure 7C:
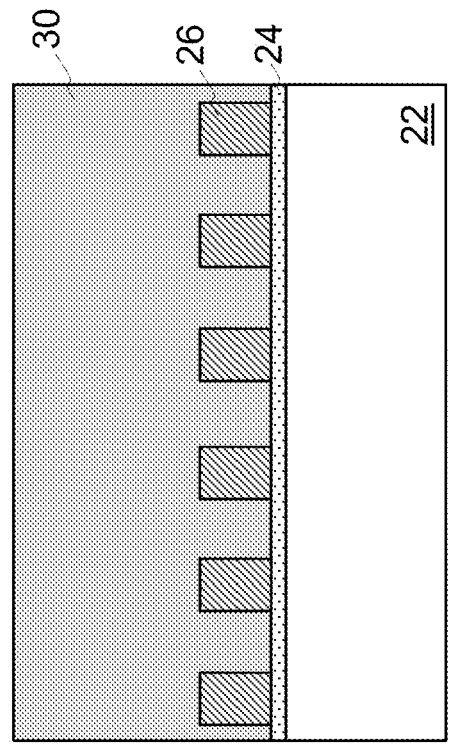
Figure 5C:
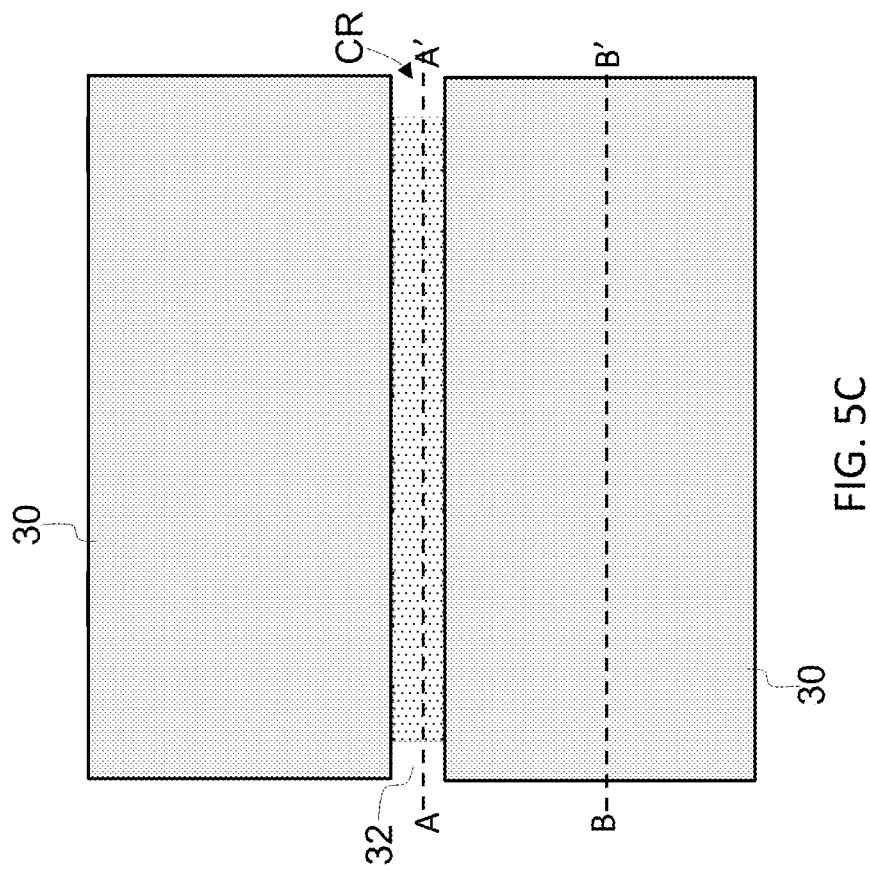
Figure 6D:
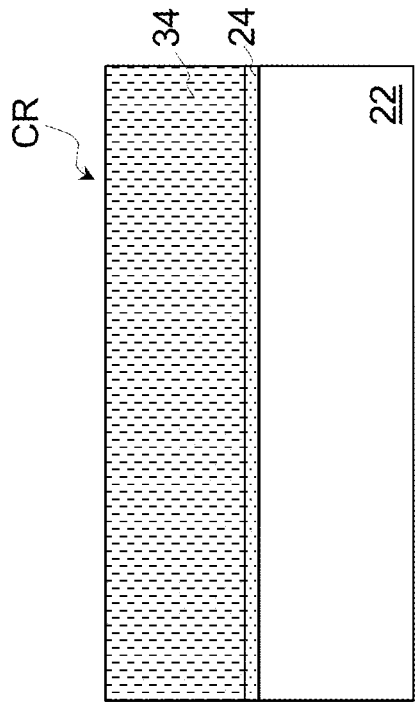
Figure 7D:
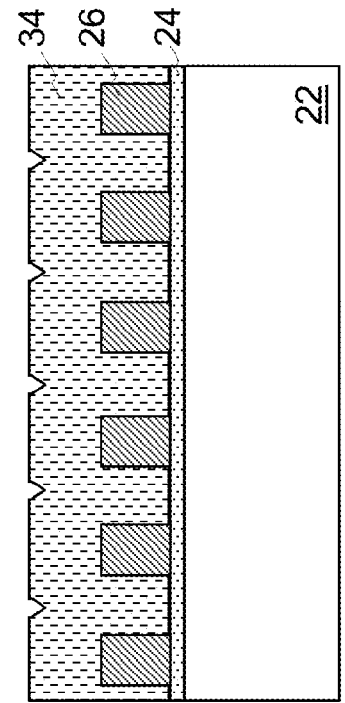
Figure 5D:
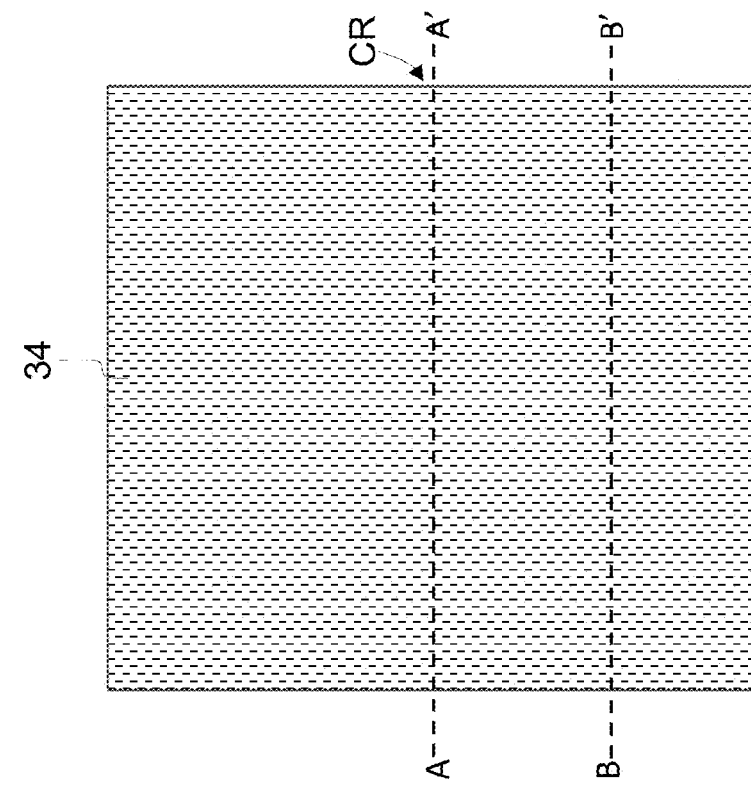
Figure 6E:
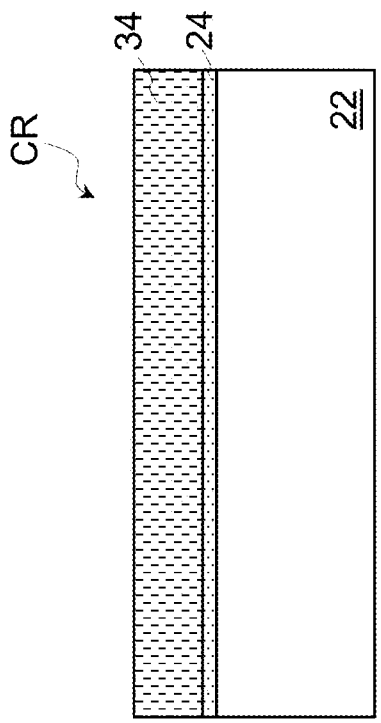
Figure 7E:
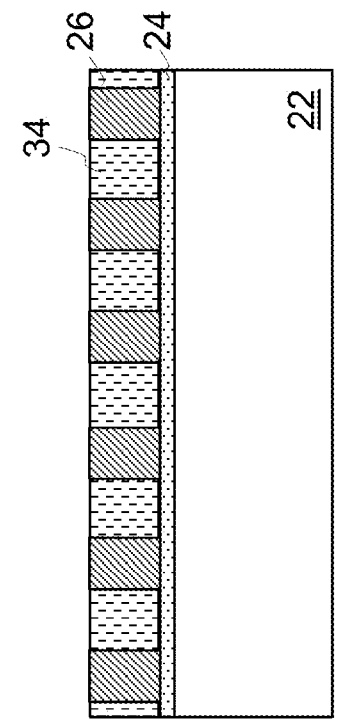
Figure 5E:
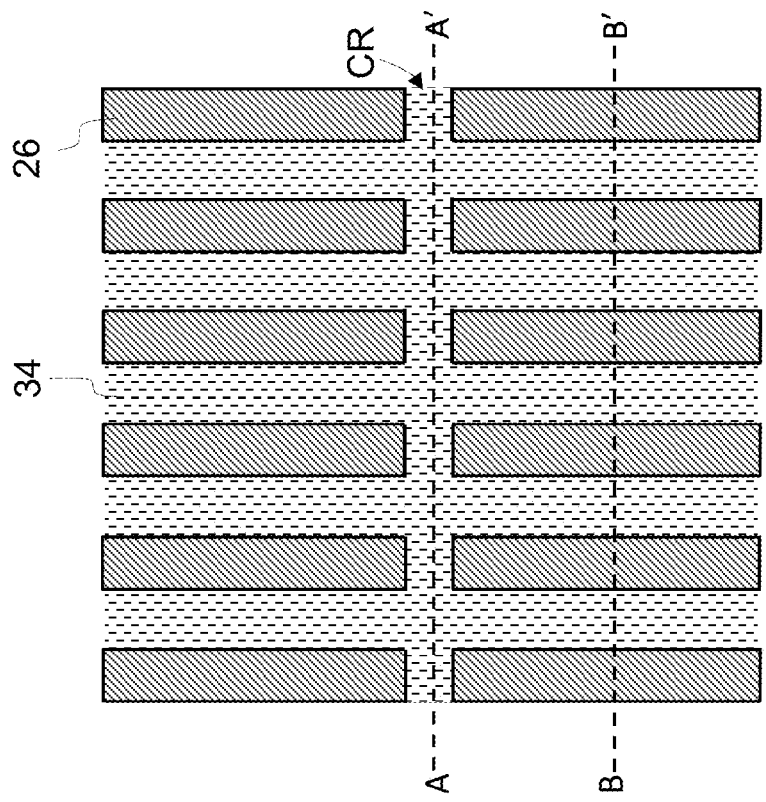

After the first photo resist 27 is removed, a second suitable photo-resist material 30 is formed on the structure. A second masking step is used to remove a horizontal strip of the photo resist 30 in a central region CR extending perpendicularly to trenches 28 (i.e. along the cross section line A-A'), resulting in a trench 32 in the photo resist 30, as shown in FIGS. 5B, 6B and 7B. Horizontal trench 32 crosses and is perpendicular to vertical trenches 28. A poly etch is then performed to remove those portions of the dummy poly 26 exposed in trench 32 (i.e. extend trench 32 into poly layer 26 in the horizontal direction in the central region CR), as shown in FIGS. 5C, 6C and 7C. The photo resist 30 is then removed. A masking material 34 such as silicon nitride (nitride) is formed over the structure, filling trenches 28 and 30, as shown in FIGS. 5D, 6D and 7D. An etch back process is then performed to remove the masking material 34 down to the tops of the columns of dummy poly 26 (i.e. use poly 26 as an etch stop), as illustrated in FIGS. 5E, 6E and 7E.

The dummy poly 26 is then removed using a poly etch process, leaving trenches 36 extending down into the masking material to expose insulation layer 24. This results in columns of masking material 34 which are separated by trenches 36, except for the central region CR which is covered by the masking material 34, as illustrated in FIGS. 5F, 6F and 7F. An oxide etch, followed by a silicon etch, are then performed to extend the trenches 36 down through layer 24 and into the substrate 22, as illustrated in FIGS. 5G, 6G and 7G.

Figure 6H:
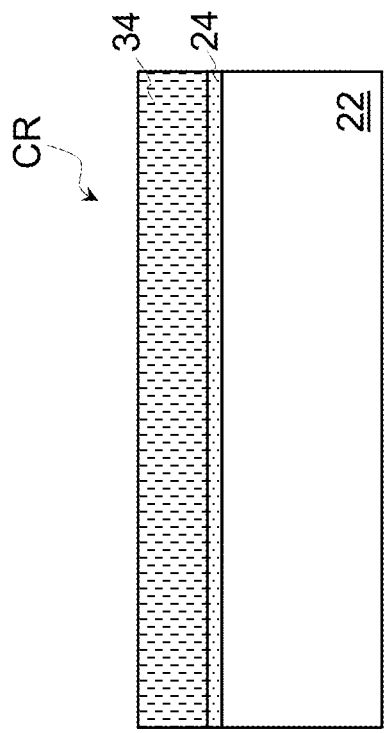
Figure 7H:
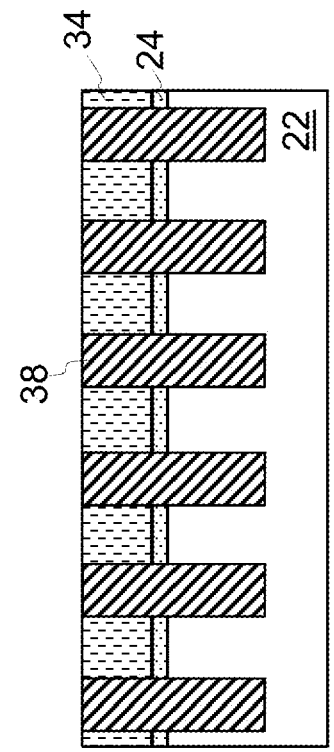
Figure 5H:
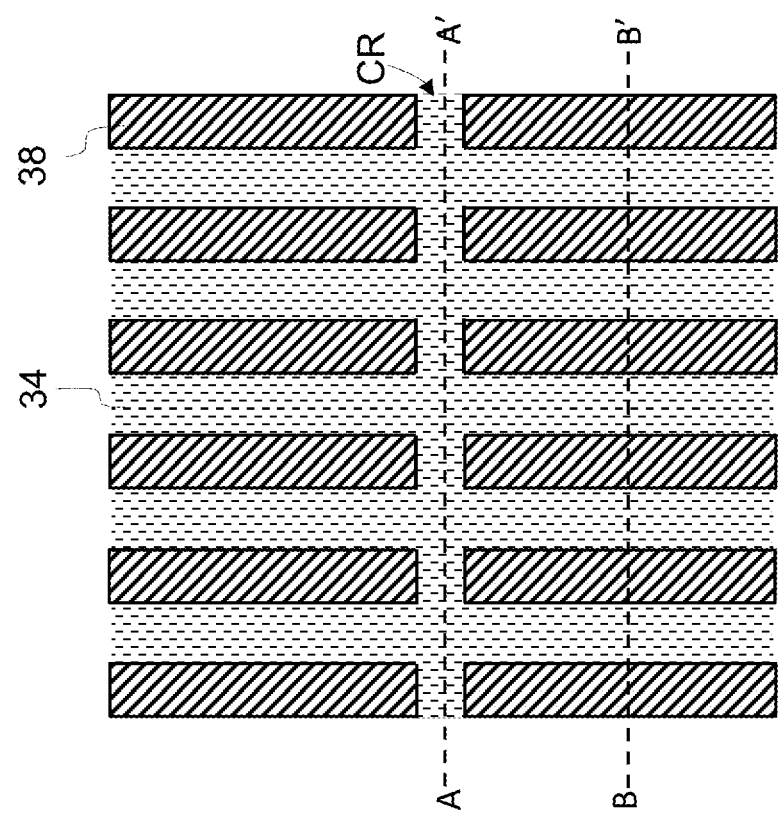
Figure 6I:
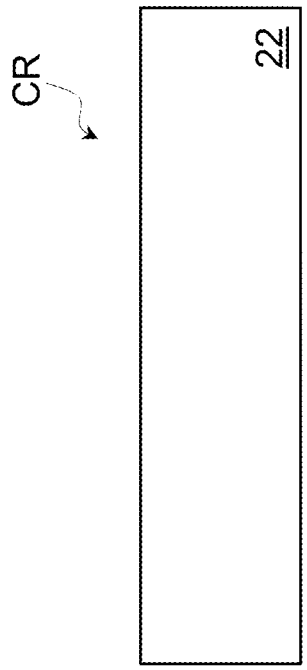
Figure 7I:
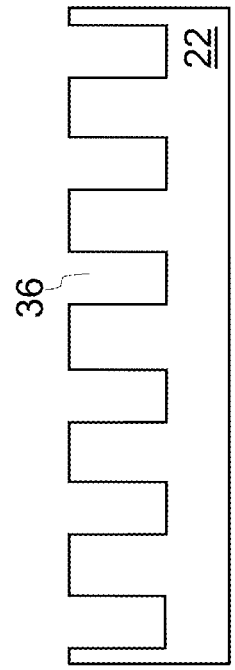
Figure 5I:
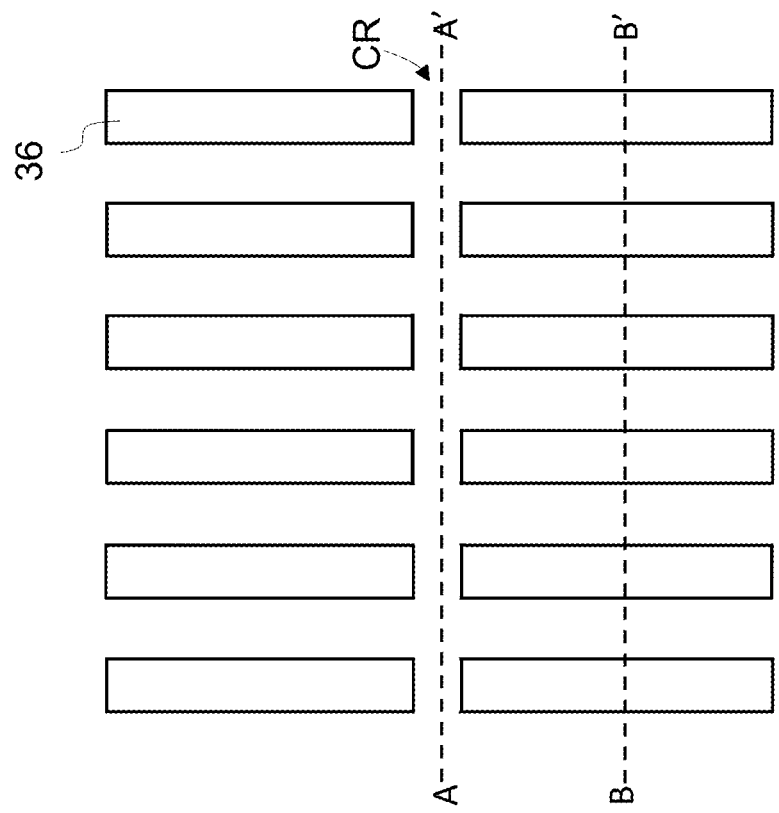

At this point, the trenches 36 can be filled with insulation material 38 such as silicon dioxide (e.g. using a silicon dioxide deposition and CMP (chemical mechanical polish) using masking material 34 as an etch stop), resulting in the structure shown in FIGS. 5H, 6H and 7H (isolation regions of oxide 38 are disposed between active areas). Alternately or additionally, nitride and oxide etches are performed on the structure in FIGS. 5G, 6G and 7G, to result in bare silicon in the central region CR and trenches 36 formed into portions of substrate 22 on either side of central region CR, as illustrated in FIGS. 5I, 6I and 7I. Thereafter, insulation can be formed in trenches 36 as is known in the art to form the isolation regions.

The above described technique, involving two photolithography processes more accurately forms the isolation regions that separate the active areas, without necessarily needing to use any special OPC. The active area critical dimension in the X direction can be independently controlled. Moreover, the critical dimensions in both the X and Y directions can be uniformly controlled.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. For example, while layers 24, 26 and 34 are described with respect to the embodiment above as oxide, poly and nitride materials, respectively, any appropriate materials exhibiting sufficiently distinguishing etch properties can be used. The pattern of isolation regions and active areas illustrated in the figures can vary and/or be replicated repeatedly on a single wafer. For example, while a single central region CR is shown in the figures, there can be a plurality of such central regions CR on a single wafer. Further, as is apparent from the claims and specification, not all method steps need be performed in the exact order illustrated or claimed, but rather in any order that allows the proper formation of the isolation regions on the substrate. Lastly, single layers of material could be formed as multiple layers of such or similar materials, and vice versa.

What is claimed is:

1. A method of processing a semiconductor substrate, comprising:
   forming a first material on a substrate surface;
   forming a second material on the first material;
   forming a plurality of first trenches into the second material, wherein the plurality of first trenches are parallel to each other;
   forming a second trench into the second material, wherein the second trench is perpendicular to and crosses the plurality of first trenches in a central region of the substrate;
   filling the first and second trenches with a third material;
   removing the second material to form third trenches in the third material that are parallel to each other and do not extend through the central region of the substrate; and
   extending the third trenches through the first material and into the substrate.

2. The method of claim 1, wherein the first material is silicon dioxide and the second material is polysilicon.

3. The method of claim 2, wherein the third material is silicon dioxide.

4. The method of claim 1, wherein the forming of the plurality of first trenches comprises:
   forming a photo resist material on the second material;
   selectively removing the photo resist material to expose columns of the second material; and
   etching away the exposed columns of the second material.

5. The method of claim 4, wherein the forming of the second trench comprises:
   forming a second photo resist material on the second material;

selectively removing a strip of the second photo resist material to expose a row of the second material; and etching away the exposed row of the second material.

6. The method of claim 1, wherein the removing of the second material exposes portions of the first material.

7. The method of claim 6, wherein the extending of the third trenches comprises:

etching away the exposed portions of the first material such that portions of the substrate are left exposed; and performing an etch on the exposed portions of the substrate.

8. The method of claim 1, further comprising:

filling the extended third trenches with insulation material.

9. The method of claim 1, further comprising, after the extending of the third trenches:

removing the third material; and removing the first material.

10. The method of claim 9, further comprising, after the removing of the third and first material:

filling the third trenches in the substrate with insulation material.

\* \* \* \* \*